(12) United States Patent
Webb (10) Patent No.: US 7,564,633 B2
(45) Date of Patent: Jul. 21, 2009

(54) CATADIOPTRIC IMAGING SYSTEM FOR HIGH NUMERICAL APERTURE IMAGING WITH DEEP ULTRAVIOLET LIGHT

(75) Inventor: James Edson Webb, Fairport, NY (US)

(73) Assignee: Corning Incorporated, Corning, NY (US)

( * ) Notice: Subject to any disclaimer, the term of this patent is extended or adjusted under 35 U.S.C. 154(b) by 206 days.

(21) Appl. No.: 11/061,200

(22) Filed: Feb. 18, 2005

(65) Prior Publication Data
US 2005/0179994 A1 Aug. 18, 2005

(51) Int. Cl.
*G02B 17/00* (2006.01)
*G02B 27/28* (2006.01)

(52) U.S. Cl. .................. 359/727; 359/495; 359/487; 359/732

(58) Field of Classification Search ......... 359/362–367, 359/368–390, 642, 850–861, 707–732, 485–495
See application file for complete search history.

(56) References Cited

U.S. PATENT DOCUMENTS

| | | | | |
|---|---|---|---|---|
| 2,683,393 | A * | 7/1954 | Drew | 359/365 |
| 3,711,184 | A | 1/1973 | Amon et al. | 359/731 |
| 4,523,816 | A | 6/1985 | Kreitzer | 359/731 |
| 5,452,126 | A | 9/1995 | Johnson | 359/407 |
| 5,650,877 | A | 7/1997 | Michaloski et al. | 359/726 |
| 5,793,538 | A * | 8/1998 | Cameron et al. | 359/731 |
| 5,930,055 | A * | 7/1999 | Eisenberg | 359/728 |
| 6,493,156 | B1 * | 12/2002 | Oh et al. | 359/742 |
| 7,075,721 | B2 * | 7/2006 | Webb et al. | 359/499 |
| 2003/0206338 | A1 * | 11/2003 | Cook | 359/356 |
| 2005/0152027 | A1 * | 7/2005 | Armstrong et al. | 359/366 |
| 2006/0082905 | A1 * | 4/2006 | Shafer et al. | 359/727 |

FOREIGN PATENT DOCUMENTS

| | | |
|---|---|---|
| SU | 1506415 | 4/1987 |
| WO | WO 03/076978 | 9/2003 |

OTHER PUBLICATIONS

Bruner, Timothy A. et al., "High Numerical Aperture Lithographic Imagery at the Brewster Angle", J. Microlith., Microfab., Microsyst., Vo;.1 No. 3, Oct. 2002.
Webb, James E., "In Search of the Optimal Objective for 157 nm", Photonics Spectra, Dec. 2003.

* cited by examiner

*Primary Examiner*—Thong Nguyen
(74) *Attorney, Agent, or Firm*—Timothy M. Schaeberle (57) ABSTRACT

A catadioptric imaging system for micro-lithographic projection features a high numerical aperture objective where most of the focusing power is produced by reflection and refraction angles are limited to avoid additional aberration. A field correcting optic is appended to a Mangin mirror in an immersive configuration for raising the numerical aperture. The optical connection between the Mangin mirror and the field correcting optic is arranged to control refraction angles by limiting angles of incidence or refractive index differences. A radially symmetric polarizing effect is achieved in a pupil to improve image contrast.

20 Claims, 5 Drawing Sheets

CATADIOPTRIC IMAGING SYSTEM FOR HIGH NUMERICAL APERTURE IMAGING WITH DEEP ULTRAVIOLET LIGHT

BACKGROUND OF THE INVENTION

1. Field of the Invention

The invention relates to imaging systems of the type in which a reflective surface provides substantial focusing power and more particularly relates to catadioptric reducing systems that exploit a combination of reflection and refraction for focusing purposes. The invention has particular applicability to Newtonian objectives for microlithographic imaging at high numerical apertures using deep ultraviolet light. The invention also contemplates issues of polarization management for imaging systems.

2. Description of Related Art

Newtonian design forms in which focusing power is attained largely by reflection have been incorporated into microlithographic instruments to accurately project images while limiting chromatic aberrations. The chromatic advantages of Newtonian design forms over all-refractive imaging systems are particularly evident for imaging with ultraviolet light where transmissive material choices are more limited.

Accompanying a trend toward the use of shorter wavelengths of ultraviolet light, higher numerical apertures are also sought to achieve higher resolution by microlithographic instruments. The high refraction angles required of known refractive objectives contribute to a number of aberrations including chromatic aberrations that are difficult to correct with the limited material choices for transmitting deep ultraviolet light (i.e., less than 200 nanometers wavelength). Certain anisotropic properties, such as intrinsic birefringence, also become evident in materials at the shorter wavelengths further complicating refractive solutions.

Although reflective optics are largely chromatically insensitive, a number of other aberrations accompany their use including spherical aberration and field curvature. Accordingly, refractive optics have been used in combination with reflective optics, balancing the strengths and weaknesses of each other in catadioptric forms of Newtonian designs. Examples of such catadioptric forms are disclosed in co-assigned U.S. Pat. No. 5,650,877 entitled "Imaging System for Deep Ultraviolet Lithography", which is hereby incorporated by reference.

Higher resolution requires either higher numerical apertures or shorter wavelengths for a given numerical aperture, and most beneficially, both. Each places demands on the imaging system. The shorter wavelengths (particularly 157-nanometer light) further limit material choices for transmission and amplify anisotropic characteristics that interfere with the uniform propagation of light. The higher numerical apertures require the severe bending of light rays that introduce a host of aberrations and further exacerbate material deficiencies.

BRIEF SUMMARY OF THE INVENTION

My invention contemplates imaging systems, particularly for microlithographic projection instruments, capable of high resolution imaging with low aberrations. The imaging systems in one or more embodiments achieve the higher resolution capabilities by accommodating wavelengths of deep ultraviolet light (i.e., less than 200 nanometers in wavelength) at high numerical apertures (i.e., 0.85 or greater). Aberrations are limited by design improvements that exploit the focusing power of reflective optics together with the corrective properties of refractive optics at low refraction angles. Polarization management is used to improve image contrast.

One example of the invention as a catadioptric imaging system is based on a double-reflecting Mangin mirror. The Mangin mirror has an optically transmissive body, a partially reflective surface at a first side of the optically transmissive body, a concave reflective surface at a second side of the optically transmissive body, an aperture within the concave reflective surface, and a concave refractive surface at the second side of the optically transmissive body within the aperture of the concave reflective surface. The concave reflective surface and the concave refractive surface at the second side of the optically transmissive body have nominal centers of curvature located in opposite directions along a common optical axis for reducing refraction angles at which imaging light exits the optically transmissive body through the aperture. A field-correcting lens having a convex refractive surface adjacent to the concave refractive surface corrects aberrations in an image field.

The partially reflecting surface is preferably a refractive surface that transmits light to the concave reflective surface. The concave reflective surface reflects the transmitted light on a converging path back toward the partially reflecting surface, and the partially reflecting surface reflects the returning light on a further converging path through the concave refractive surface toward a focal point of the Mangin mirror. The convex refractive surface of the field-correcting lens has a nominal center of curvature that departs from the nominal center of curvature of the concave refractive surface for influencing a correction in the image field.

The field-correcting lens preferably includes a lens body having first and second sides located along the optical axis. The convex refractive surface is at a first side of the lens body and another refractive surface is at a second side of the lens body. The refractive surface at the second side of the lens body preferably forms an immersion interface shaped for refracting the light into a liquid optical medium adjacent to the image plane. Overall, the field-correcting lens can have a net positive power, and the immersion interface can have a nominally planar form. Alternatively, the immersion interface can have a concave form for reducing refraction between the field-correcting lens and the liquid medium.

To minimize the introduction of aberrations while correcting others, refraction is preferably limited at the concave refractive surface of the Mangin mirror by limiting angles of incidence presented by the converging beam incident upon the concave refractive surface. Refraction can be similarly limited at the convex refractive surface of the field-correcting lens by limiting curvature differences between the convex refractive surface of the field correcting lens and the concave refractive surface of the Mangin mirror. Refraction can be limited at the immersion surface by limiting a difference between an index of refraction of the lens body and an index of refraction of the liquid optical medium.

The partially reflective surface at the first side of the Mangin mirror's transmissive body preferably has a nominally planar form oriented substantially normal to the common optical axis of the concave reflective surface and the concave refractive surface at the second side of the optically transmissive body. A number of advantages are associated with this form. The planar surface reflects marginal rays at higher angles of convergence toward the aperture than concave surfaces that are ordinarily used in Mangin mirrors described in the prior art. The higher convergence angles support higher numerical aperture imaging with less reliance on the focusing power of refractive optics. The angles of incidence and reflection are equal with respect to the optical axis so that rays traverse the Mangin mirror's body at substantially equal angles in opposite directions to rotationally balance angularly sensitive asymmetries, such as angularly dependent birefringence. The planar form of the partially reflective surface also provides manufacturing advantages for the Mangin mirror by simplifying de-wedging requirements for orienting the concave reflective surface, the concave refractive surface, and the partially reflective surface with respect to each other along the common optical axis.

Another example of a catadioptric imaging system in accordance with my invention includes a primary focusing optic having a refractive body, a reflective surface at one side of the focusing optic's refractive body, a refractive surface at an opposite side of the focusing optic's refractive body, and an aperture within the reflective surface. The refractive surface is partially transmissive for transmitting light to the reflective surface, the reflective surface has a concave form for reflecting the transmitted light on a converging path back toward the refractive surface, and the refractive surface is partially reflective for reflecting the returning light on a further converging path through the aperture toward an image plane of the imaging system. Adjacent to the aperture of the primary focusing optic is a bilateral immersion optic having a refractive body. A first immersive surface at one side of the immersion optic's refractive body is shaped for exposure to a liquid optical medium between the bilateral immersion optic and the aperture of the primary focusing optic. A second immersive surface at an opposite side of the immersion optic's refractive body is shaped for exposure to a liquid optical medium between the bilateral immersion optic and the image plane.

A peripheral seal can be used for confining the liquid optical medium between the bilateral immersion optic and the primary focusing optic. The bilateral immersion optic can also shaped to accommodate a refractive index of the liquid optical medium exposed to the first immersive surface different from a refractive index of the liquid optical medium exposed to the second immersive surface. The refractive index of the liquid optical medium exposed to the second immersive surface can be higher than the refractive index of the liquid optical medium exposed to the first immersive surface for optimizing numerical aperture.

The first immersive surface of the bilateral immersion optic can have a convex form, and the second immersive surface of the bilateral immersion optic can have a planar form. Refraction is preferably limited at the aperture of the primary focusing optic by limiting a difference between an index of refraction of the focusing optic's refractive body and an index of refraction of the liquid optical medium exposed to the first immersive surface of the bilateral immersion optic. Similarly, refraction is preferably limited at the first immersive surface of the bilateral immersion optic by limiting a difference between an index of refraction of the bilateral immersion optic's refractive body and the index of refraction of the liquid optical medium exposed to the first immersive surface. Refraction is also similarly limited at the second immersive surface of the bilateral immersion optic by limiting a difference between the index of refraction of the bilateral immersion optic's refractive body and an index of refraction of the liquid optical medium exposed to the second immersive surface.

The invention also includes among its embodiments, a double-reflecting Mangin mirror of the type including an optically transmissive body having first and second sides, a first refractive surface at the first side of the optically transmissive body; a reflective surface at the second side of the optically transmissive body, and an aperture within the reflective surface. The Mangin mirror also includes a second refractive surface at the second side of the optically transmissive body within the aperture. The reflective surface at the second side of the optically transmissive body has a first surface form. The second refractive surface at the second side of the optically transmissive body has a second surface form that is different from the first surface form, and the first refractive surface on the first side of the optically transmissive body has a third surface form that is different from at least one of the first and second surface forms.

The reflective surface at the second side of the optically transmissive body is preferably a concave reflective surface. The second refractive surface at the second side of the optically transmissive body is preferably a concave refractive surface. As such, the reflective surface and the second refractive surface can share a common optical axis and have nominal centers of curvature located in opposite directions along the common optical axis for reducing refraction angles at which imaging light exits the optically transmissive body through the aperture.

The first refractive surface is preferably partially transmissive for transmitting light to the reflective surface. The reflective surface preferably has a concave form for reflecting the transmitted light on a converging path back toward the first refractive surface, and the first refractive surface is preferably partially reflective for reflecting the returning light on a further converging path through the second refractive surface toward a focal point. A nominal center of curvature of the concave refractive surface preferably departs from the focal point of the Mangin mirror to avoid retroreflecting light from the concave refractive surface.

The first refractive surface preferably has a planar or convex (non-concave) surface form for optimizing the angles of convergence for the light reflected on a further converging path. A reflective coating can enhance the partial reflectivity of the first refractive surface. Preferably, the coating provides higher reflectivity in the vicinity of the light reflected from the first refractive surface and lower reflectivity in the vicinity of the light transmitted through the first refractive surface.

An example of the invention as Newtonian-imaging system includes a partially reflective interface between a first optical medium and a second optical medium, a concave reflector adjacent to the second optical medium, and an aperture formed in the concave reflector. An at least partially transmissive interface is located within the aperture between the second optical medium and a third optical medium. An immersion lens incorporating a fourth optical medium is located between the third optical medium and a fifth optical medium. The fifth optical medium is a liquid optical medium for optically connecting the immersion lens to an image plane.

A first optical pathway connects the first optical medium to the concave reflector through the partially reflective interface and the second optical medium. A second optical pathway connects the concave reflector to the partially reflective interface through the second optical medium. A third optical pathway connects the partially reflective interface to the image plane through the second optical medium, the at least partially transmissive interface, the third optical medium, the fourth optical medium of the immersion lens, and the fifth optical medium.

The immersion optic can have a first refractive surface adjacent to the third optical medium and a second refractive surface adjacent to the fifth optical medium. The first refractive surface is preferably a convex refractive surface. The third optical medium can also be a liquid optical medium. However, the second optical medium is preferably a solid optical medium and the at least partially transmissive interface is formed between a refractive surface in the solid optical medium and the third optical medium.

Yet another example of my invention is embodied in a catadioptric imaging system for deep ultraviolet light having a Newtonian form. A combined reflective and refractive optic includes a refractive body, a reflective surface at one side of the refractive body, a refractive surface at an opposite side of the refractive body, and an aperture within the reflective surface along an optical axis. The refractive surface is partially transmissive for transmitting light to the reflective surface. The reflective surface has a concave form for reflecting the transmitted light on a converging path back toward the refractive surface. The refractive surface is also partially reflective for reflecting the returning light on a further converging path through the aperture toward a focal point located along the optical axis. The refractive surface has a non-concave form so that the light approaching the refractive surface from the reflective surface is inclined to the optical axis through a first angle that is less than or equal to a second angle at which the light reflected by the refractive surface is inclined to the optical axis.

The second angle, by being at least as great as the first, provides for optimizing the reflecting focusing power of the combined reflective and refractive optic to achieve a desired numerical aperture while minimizing the residual requirements for focusing power through refraction. For example, the refractive surface can have a convex form so that the second angle is greater than the first angle or a nominally planar form so that the first and second angles are substantially equal. In the case of the latter where the refractive body is made of a cubic crystalline material, the substantially planar form of the refractive surface can be used to radially balance birefringence effects of the crystalline material.

The refractive surface can also be treated to influence other optical properties including intensity and polarization distributions between marginal and paraxial rays. For example, a partially reflective treatment can be applied to the refractive surface so that reflectivity of the refractive surface varies as a function of radial distance from the optical axis to compensate for variations in reflectivity as a function of variations in angles of incidence at with the light approaches the refractive surface. For purposes of polarization management, the surface forms of the reflective and refractive surfaces can be related so that rays of the light approaching the refractive surface from the reflective surface strike the surface at angles of incidence that reflect one polarization direction substantially more than another orthogonal polarization direction resulting in a radially symmetric polarization pattern. The remaining symmetrically polarized light is capable of forming higher contrast images.

In fact, the invention can be specifically arranged to reduce the polarization components that can adversely affect image contrast. An immersive imaging system so arranged can include an assembly of imaging optics optically connecting an object plane with an image plane along an optical reference axis. A liquid optical medium couples an adjacent one of the imaging optics to the image plane. A pupil is located along the optical reference axis between the object plane and the image plane at an intersection of overlapping bundles of rays extending between the object points in the object plane and image points in the image plane. An angularly sensitive polarizer located within a domain of the pupil polarizes the overlapping bundles of rays within the pupil with a radial (e.g., polar orthogonal) symmetry that reduces, for example, TM polarization components of the rays parallel to axial planes of incidence at the image plane without substantially reducing TE polarization components of the rays perpendicular to the axial planes of incidence at the image plane. An angularly sensitive polarizer could also be used to reduce TE polarization components with respect to TM polarization components with similar polar orthogonal symmetry.

Preferably, the symmetry is radial, and the angular sensitivity of the polarizer is apparent from both the polar coordinate angle (typically "$\theta$") about the reference axis (the basis for radial symmetry) and the spherical coordinate angle (typically "$\phi$") inclined to the reference axis (which affects the magnitude of the polarization effect. For example, while the polarization effect can vary with the inclination angle "$\phi$" to the reference axis, the effect associated with the inclination angle "$\phi$" can be the same throughout the full range of polar angles "$\theta$" around the reference axis. A polar orthogonal symmetry can be achieved by favoring TE polarization components oriented in either a radial or preferably azimuthal polarization pattern.

The imaging system is preferably a telecentric imaging system, particularly for purposes of microlithographic projection, in which chief rays that intersect at the pupil extend substantially parallel to the reference axis at the image plane (e.g., resist). The polarizing optic can be located adjacent to an aperture stop of the telecentric system.

The TM polarization components of the rays are subject to variations in inclination to the reference axis complementary to the inclination of the rays through angle "$\phi$" to the reference axis. The TE polarization components of the rays remain orthogonal to the reference axis despite the inclination of the rays to the reference axis. The angularly sensitive polarizer preferably reduces the TM polarization components of the rays as a function of the inclination of the rays to the reference axis at the image plane. As such, the TM polarization components of rays that are more inclined to the reference axis are reduced more than the TM polarization components of the rays that are less inclined to the reference axis. Thus, the polarization effect is most pronounced for the marginal rays, which are inclined the most to the reference axis.

The polarizer can be a partially reflective surface within the imaging system. For example, the partially reflective surface can be a surface of a Mangin mirror also having a transmissive optical body, a concave reflective surface on one side of the transmissive optical body, and an aperture within the reflective surface. The partially reflective surface is located on another side of the transmissive optical body. The overlapping bundles of rays reflect from the concave reflective surface on a converging path toward the partially reflective surface and reflect from the partially reflective surface on a converging path through the aperture. The partially reflective surface can be a planar surface so that the inclination of the rays to a normal of the planar surface matches the inclination of the rays to the reference axis or a convex surface so that the inclination of the rays to a normal of the planar surface is less than the inclination of the rays to the reference axis. Preferably, the overlapping bundles of rays include marginal rays, and the marginal rays approach the partially reflective surface from the concave reflective surface at an angle of incidence at which the TE polarization components are reflected substantially more that the TM polarization components. The incidence angle of the marginal rays is preferably less than the angle of total internal reflection (TIR).

An imaging system with radial polarization symmetry not confined to an immersive system can also be configured within an assembly of imaging optics optically connecting an object plane with an image plane along an optical reference axis. A pupil is located along the optical reference axis between the object plane and the image plane at an intersection of overlapping bundles of rays extending between the object points in the object plane and image points in the image plane. The imaging optics include a refractive interface located within a domain of the pupil and arranged as an angularly sensitive polarizer that polarizes the overlapping bundles of rays within the pupil with a radial symmetry that differentially affects TM polarization components of the rays parallel to axial planes of incidence at the image plane with respect to TE polarization components of the rays perpendicular to the axial planes of incidence at the image plane. The refractive interface is shaped in cooperation with the other imaging optics to limit incidence angles of the overlapping bundles of rays at the refractive interface to angles that are less that those required for total internal reflection at the refractive interface.

The differential effect of the angularly sensitive polarizer preferably favors reflecting one of the polarization components over the other of the polarization components. For example, the polarizer can reflect one of the polarization components to the exclusion of the other of the polarization components as a function of the inclination of the rays with respect to a normal of the refractive interface at the point of incidence.

The angularly sensitive polarizer preferably polarizes the overlapping bundles of rays within the pupil with a radial symmetry that reduces TM polarization components of the rays parallel to axial planes of incidence at the image plane without substantially reducing TE polarization components of the rays perpendicular to the axial planes of incidence at the image plane. The TM polarization components of the rays are subject to variation in inclination to the reference axis complementary to the inclination of the rays to the reference axis at the image plane. The TE polarization components of the rays remain orthogonal to the reference axis despite the inclination of the rays to the reference axis at the image plane. As such, the polarizer preferably reduces the TM polarization components of the rays as a function of the inclination of the rays to the reference axis at the image plane.

The refractive interface can be formed as a non-concave refractive surface so that the inclination of imaging rays with respect to a normal of the non-concave refractive surface is no greater than the inclination of the same imaging rays with respect to the reference axis. For example, the refractive interface can be formed as a convex refractive surface so that the inclination of imaging rays with respect to a normal of the non-concave refractive surface is less than the inclination of the same imaging rays with respect to the reference axis.

DETAILED DESCRIPTION OF THE INVENTION

Figure 1:
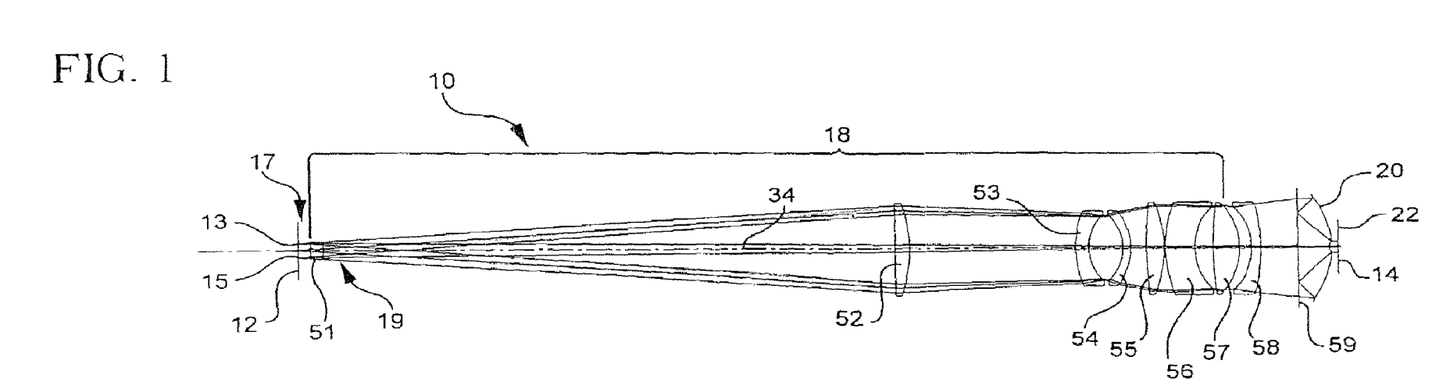
FIG. 1 is a diagram of a catadioptric imaging system for microlithographic projection with an immersion optic adjacent to an image plane.
Figure 3:
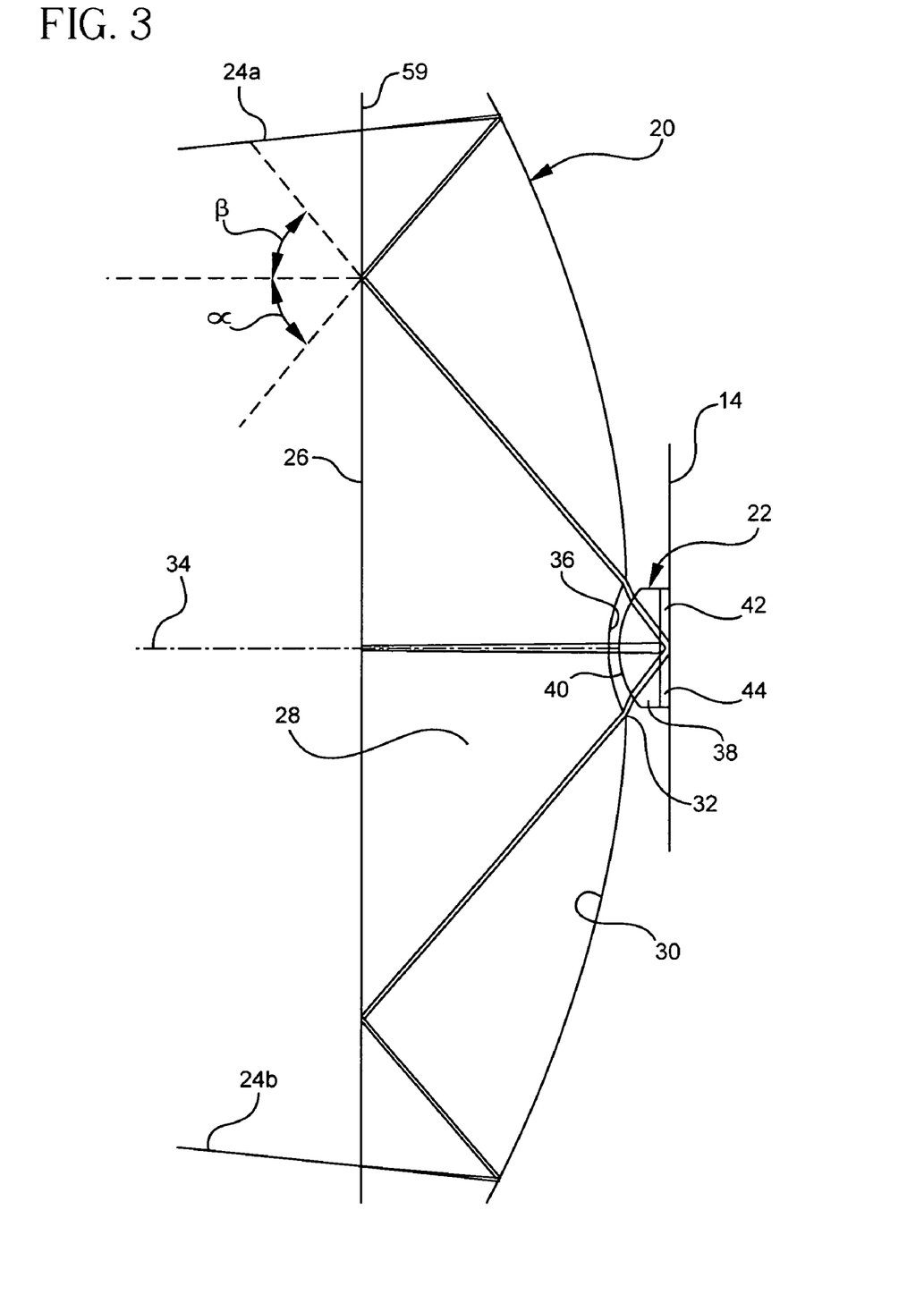
FIG. 3 is an enlarged diagram of a Mangin mirror and single-immersion field correcting optic of the imaging system of FIG. 1.

A catadioptric imaging system 10 for microlithographic projection is shown in FIG. 1 in an arrangement for imaging a reticle 12 (object) onto a resist 14 (image). An enlarged view of a double-reflecting Mangin mirror 20, which provides substantial focusing power for the imaging system 10, is shown in FIG. 3. An assembly 18 of largely refractive components is arranged for filling the aperture of the double-reflecting Mangin mirror 20 while assisting in the correction of aberrations. Throughout the assembly 18, refraction angles are minimized to avoid the introduction of unnecessary aberrations. A field correcting optic 22 operating in an immersion mode works in conjunction with the Mangin mirror 20 to produce a final image of the reticle 12 on a focal plane of the resist 14.

The focusing power of the double-reflecting Mangin mirror 20, which is positioned at or near a pupil of the imaging system 10, is apparent from the depicted paths of marginal rays 24a and 24b through the Mangin mirror 20. The marginal rays 24a and 24b enter the Mangin mirror 20 through a partially reflective surface 26, which is formed on a front side of an optically transmissive body 28. The marginal rays 24a and 24b propagate through the optically transmissive body 28 and are reflected by a concave reflective surface 30 on the back side of the optically transmissive body 28. After reflecting, the marginal rays 24a and 24b propagate along a converging path through the optically transmissive body 28 a second time to the partially reflective surface 26. The marginal rays 24a and 24b re-encounter the partially reflective surface 26 at a higher angle incidence than the angle of incidence at which they were first transmitted through the partially reflective surface 26. At the higher angles of incidence, each of the marginal rays 24a and 24 includes a substantial component that reflects from the partially reflective surface 26 for propagating along a further converging path through the optically transmissive body a third time toward an aperture 32 formed in the concave reflective surface 30.

The optically transmissive body 28 is preferably a refractive body made of an optical material that is transmissive at deep UV wavelengths of light (i.e., less than 200 nanometers), such as fused silica or calcium fluoride. The partially reflective surface 26 is preferably a refractive surface formed on the front side of the refractive body. Coatings or other treatments can be applied to the refractive surface, such as coatings regulating matters of transmission, reflection, or polarization. In addition to the varying angles of incidence between the transmissive and reflective encounters of the marginal rays 24a and 24b, the rays (of which the marginal rays 24a and 24b are examples) that transmit through the partially reflective surface 26 are spaced farther from an optical axis 34 of the Mangin mirror 20 than the rays that are reflected from the partially reflective surface 26. This affords a further opportunity to differentiate between the rays that are transmitted and the rays that are reflected at partially reflective surface 26 by treating the partially reflective surface 26 as a function of radial distance from the optical axis 34. The treatments, which can include reflective or anti-reflective coatings, can be applied to reinforce transmission in radially defined areas of the partially reflective surface 26 primarily responsible for transmitting the rays toward the concave reflective surface 30 and to reinforce reflection in radially defined areas of the partially reflective surface 26 primarily responsible for reflecting the rays toward the aperture 32.

A concave refractive surface 36 is formed in the optically transmissive body 28 within the aperture 32. The concave refractive surface 36, which has a nominal center of curvature located along the optical axis 34 in a direction opposite to the location of a nominal center of curvature of the concave reflective surface 30, limits refraction angles (e.g., to less than 10 degrees) through which the marginal rays 24a and 24b are bent upon exiting the Mangin mirror element 20. For a similar purpose, the field optic 22, which also has an optically transmissive body 38 (e.g., a lens body), includes a convex refractive surface 40 adjacent to the concave refractive surface 36 of the Mangin mirror. The marginal rays 24a and 24b approach both the concave surface 36 on the back side of the Mangin mirror 20 and the convex surface 40 on a front side of the field optic 22 at limited angles of incidence to reduce the amount of refraction occurring at the two surfaces 36 and 40 (e.g., to less than 10 degrees). In addition, the convex refractive surface 40 of the field optic 22 fits closely together with the concave refractive surface 36 of the Mangin element 20 to limit the distance through which refraction is effective for introducing aberration between the surfaces 36 and 40. However, the centers of curvature of the adjacent concave and convex surfaces 36 and 40 depart slightly from each other to provide a corrective focusing function.

The back side of the field correcting optic 22 has an immersion surface 42 that is exposed to a liquid optical medium 44, such as de-gassed water, for forming an immersion interface with the photo resist 14. The immersion surface 42 preferably has a planar form (making the field optic 22 a plano-convex lens) adjacent to the resist 14. Although the marginal rays 24a and 24b approach the immersion surface 42 at high angles of incidence, refraction is limited (e.g., to less than 10 degrees) at the surface 42 because of the liquid optical medium 44 into which the rays 24a and 24b enter has an index of refraction much closer to the index of refraction of the focusing optic's transmissive body 38 than air. The higher index of refraction of the liquid optical medium 44 also supports a significantly higher numerical aperture at which the marginal rays 24a and 24b come to focus on the resist 14. The immersion surface 42 can also take a concave form to further limit refraction between the field correcting optic 22 and the liquid optical medium 44, but with some sacrifice of field of view.

As now apparent, the majority of the focusing power of the imaging system 10 is provided by the reflections of the Mangin mirror 20. Increasing the curvature of the concave reflective surface 30 can increase the focusing power. However, increasing the curvature of the concave reflective surface 30 can also limit the aperture size at which the Mangin mirror 20 is effective for doubly reflecting light. Normally, the refractive surfaces of Mangin mirrors are concave to reduce the effects of spherical aberration. However, the partially reflective surface 26 of the Mangin mirror 20 is preferably non-concave, including nearly planar, so that the marginal rays 24a and 24b reflected from the partially reflective surface 26 are inclined to the optical axis 34 by converging angles "β" that are at least as great as the converging angles "α" at which the marginal rays 24a and 24b are reflected from the concave reflective surface 30.

As shown in the illustrated embodiment, the partially reflective surface 26 is a planar surface oriented normal to the optical axis 34. Accordingly, the angle "α" at which the rays 24a and 24b are first converged by the concave reflective surface 30 is preserved by reflection from the partially reflective surface 26 so that the two reflection angles "α" and "β" are equal. Even larger "β" angles are possible by forming the partially reflective surface 26 as a convex surface. However, the planar form of the partially reflective surface 26 has significant manufacturing advantages, such as providing for more easily aligning the partially reflective surface 26 with both the concave reflective surface 30 and the concave refractive surface 34 of the Mangin mirror 20.

A table follows, listing the fabrication data in millimeters for making the illustrated catadioptric imaging system 10 operating at a 193.3 nanometer reference wavelength over a range of 192.6 to 194 nanometers with a numerical aperture of 1.2 and a 15× reducing power.

| Element | Radius of Curvature | | | Aperture Diameter | | |
|---|---|---|---|---|---|---|
| Number | Front | Back | Thickness | Front | Back | Material |
| Object 12 | INF | | 7.0000 | | | |
| 51 | 43.3356 | 37.2553 | 6.6881 | 11.6500 | 11.5829 | Silica |
| Space | | | 333.3049 | | | |
| 52 | 1024.2604 | −137.0424 | 8.0616 | 65.7105 | 66.0127 | CaF$_2$ |
| Space | | | 96.2258 | | | |
| 53 | 87.4466 | 40.8464 | 7.5129 | 53.5077 | 49.9088 | Silica |
| Space | | | 20.0310 | | | |
| 54 | −43.8045 | −54.6894 | 5.0000 | 51.2325 | 55.5014 | Silica |
| Space | | | 8.5625 | | | |
| 55 | 296.4268 | −118.5802 | 10.4736 | 64.9622 | 66.0260 | CaF$_2$ |
| Space | | | 0.0200 | | | |
| 56 | 99.6257 | 56.2463 | 17.7410 | 67.2065 | 63.6415 | CaF$_2$ |
| Space | | | 10.3943 | | | |
| 57 | 266.5824 | −60.6273 | 15.0404 | 64.8690 | 65.6625 | CaF$_2$ |
| Space | | | 7.3373 | | | |
| 58 | −53.6837 | −153.2293 | 5.000 | 63.6834 | 67.5688 | Silica |
| Space | | | 21.3538 | | | |
| APERTURE STOP 59 | | | | 74.2546 | | |
| Space | | | 0.0200 | | | |
| 28 (26-30) | INF | −82.8138 | 18.9632 | 74.2605 | 76.0852 | Silica |
| 30 | −82.8138 | | | 76.0852 | | REFL |
| 28 (30-26) | −82.8138 | INF | −18.9632 | 76.0852 | 76.0852 | Silica |
| 26 | INF | | | 53.4919 | | REFL |
| 28 (26-36) | INF | 11.0239 | 17.5713 | 53.4919 | 76.0852 | Silica |
| Space | | | 0.6823 | | | |

-continued

| Element Number | Radius of Curvature | | Thickness | Aperture Diameter | | Material |
| --- | --- | --- | --- | --- | --- | --- |
| | Front | Back | | Front | Back | |
| 38 (40-42) | 6.6465 | INF | 2.9229 | 7.3577 | 2.5339 | $CaF_2$ |
| 44 | INF | INF | 0.6000 | 2.5339 | 0.7070 | $H_2O$ |
| IMAGE 14 | | INF | | 0.7070 | | |

Other first order data for defining the imaging system follows where FFL is measured from the first surface and BFL is measured from the last surface.

| INFINITE CONJUGATES | |
| --- | --- |
| EFL | 53.4911 |
| BFL | −2.9659 |
| FFL | 551.6155 |
| F/NO | 0.4219 |
| AT USED CONJUGATES | |
| REDUCTION | 0.0667 |
| FINITE F/NO | 0.4167 |
| OBJECT DIST | 7.0000 |
| TOTAL TRACK | 601.5438 |
| IMAGE DIST | 0.6000 |
| OAL | 593.9438 |
| PARAXIAL IMAGE HT | 0.3535 |
| PARAXIAL IMAGE DIST | 0.6001 |
| SEMI-FIELD ANGLE | 0.5551 |
| ENTR PUPIL DIAMETER | 88.2731 |
| ENTR PUPIL DISTANCE | 542.9388 |
| EXIT PUPIL DIAMETER | 378.8727 |
| EXIT PUPIL DISTANCE | 226.6206 |

Figure 2:
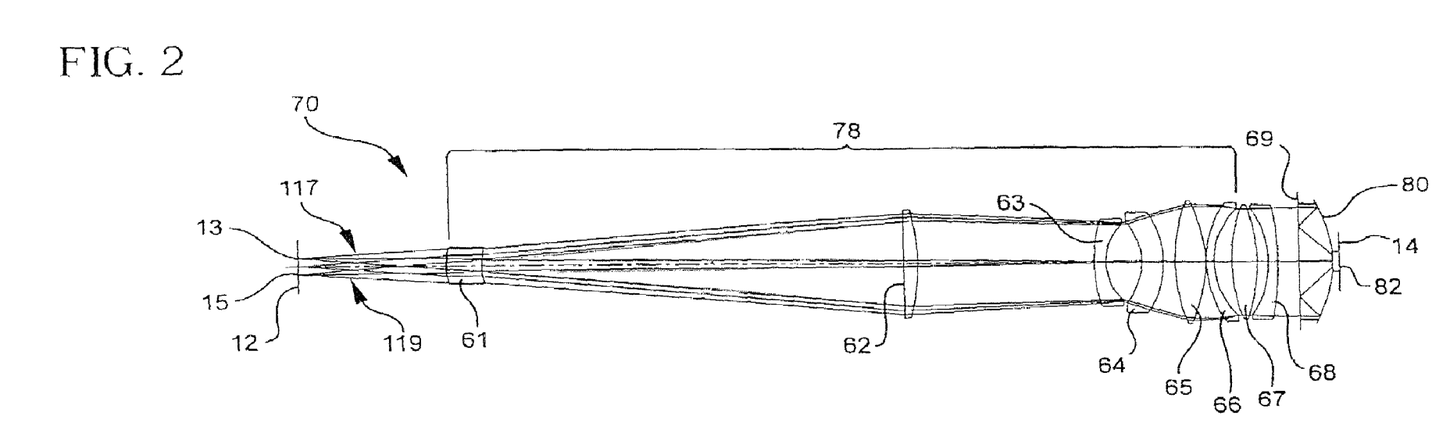
FIG. 2 is a similar diagram of a catadioptric imaging system with a bilateral immersion optic adjacent to an image plane.
Figure 4:
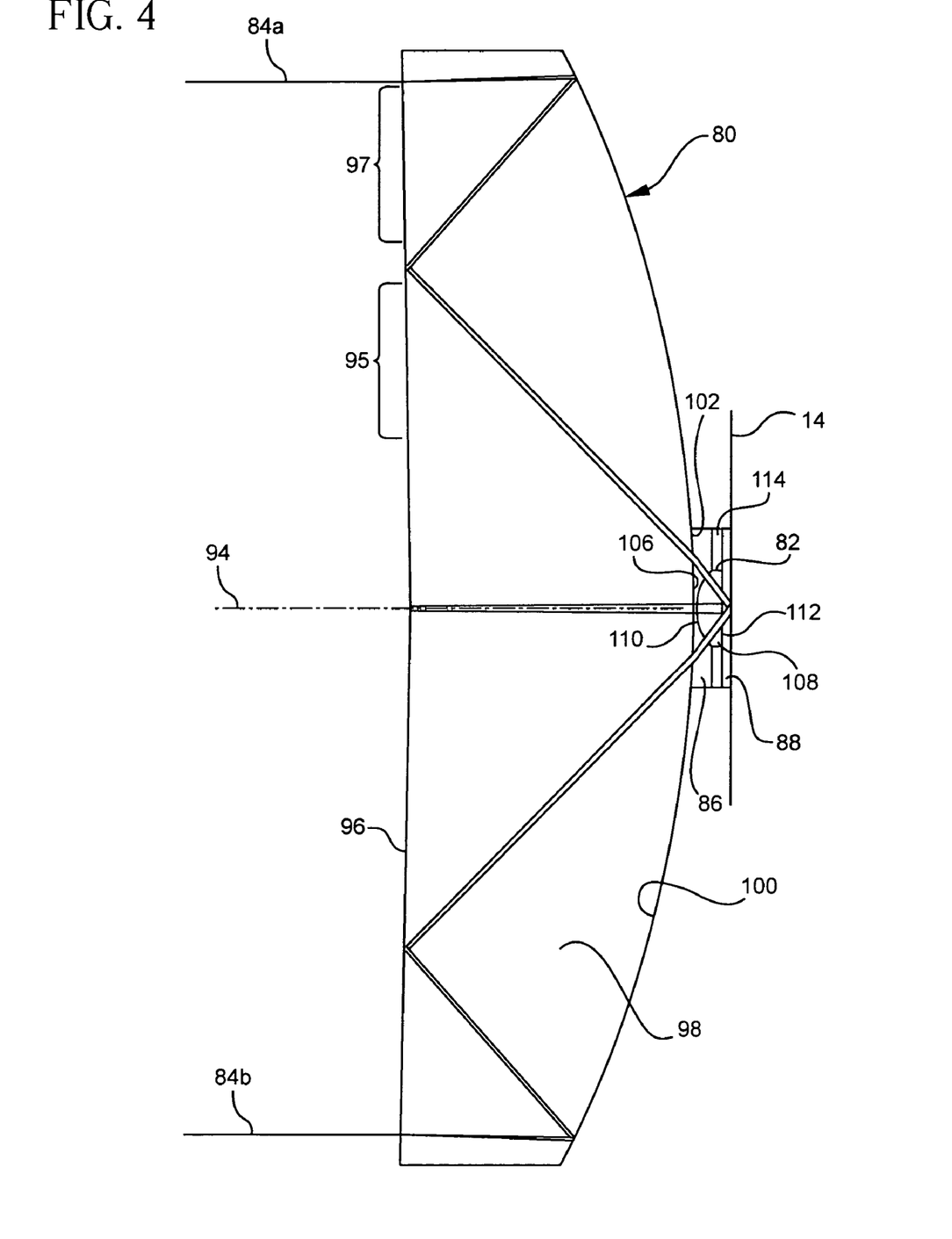
FIG. 4 is an enlarged diagram of a Mangin mirror and double-immersion field correcting optic of the imaging system of FIG. 2.

Another catadioptric imaging system 70 in accordance with the invention is shown in FIG. 2. adapted for use with a double-reflecting Mangin mirror 80 shown in FIG. 4. Similar to the preceding catadioptric imaging system 10, the catadioptric imaging system 70 has a Newtonian form for projecting an image of the reticle 12 (object) onto the resist 14 (image) at a high reduction ratio. Most of the focusing power is provided by the double-reflecting Mangin mirror 80. A refractive optical assembly 78 fills the aperture of the double-reflecting Mangin mirror 80 while compensating for various aberrations that arise within the imaging system 70. The double-refracting Mangin mirror 80 is located at or near the pupil of a telecentric imaging system in image space. As shown in FIG. 4, a field correcting optic 82 is arranged as a bilateral immersion optic between two liquid optical mediums 86 and 88. The liquid optical medium 86 connects the double-reflecting Mangin mirror 80 to the field optic 82, and the liquid optical medium 88 connects the field optic 82 to the resist 14 in an image plane of the imaging system 70.

Similar to the preceding embodiment, marginal rays 84*a* and 84*b*, which are representative of a range of rays brought to focus by the imaging system 70, enter a refractive body 98 (a transmissive optical body) of the Mangin mirror 80 through a refractive surface 96, which is adapted to be both partially transmissive and partially reflective. The marginal rays 84*a* and 84*b* approach the refractive surface 96 at near normal incidence and for this reason (among others) tend to transmit thorough the refractive surface 96. After traversing the refractive body 98, the marginal rays 84*a* and 84*b* reflect from a concave reflective surface 100 formed on the back side of the refractive body 98. The reflected marginal rays 84*a* and 84*b* are directed along a converging path through the refractive body 98 a second time, inclined to an optical axis 94 of the Mangin mirror 80 through an angle "α". Each of the converging marginal rays 84*a* and 84*b* includes a significant component that reflects from the refractive surface 96 on a further converging path through the refractive body 98 a third time, inclined to an optical axis 94 of the Mangin mirror 80 through an angle "β". The refractive surface 96 is shaped (e.g., has a non-concave and, preferably, nearly planar form) so that the marginal rays 84*a* and 84*b* reflect from the refractive surface 96 at an angle "β" that is equal to or greater than the angle "α" at which the marginal rays 84*a* and 84*b* reflect from the concave reflective surface 100.

The reflectivity of the refractive surface 96 results at least in part from (a) a difference between the refractive index of the refractive body 98 and its adjacent air medium and (b) the angles of incidence at which the converging rays approach the refractive surface 96. In addition, coatings can be applied to more efficiently govern the transmission and reflection of light across the refractive surface 96. For example, a coating can be applied to the refractive surface 96 that further differentiates on the basis of incidence angle or position on the refractive surface 96 for more efficiently transmitting and reflecting the range of rays that are brought to focus by the imaging system 70. For example, reflectivity of the coating can be increased in an annular region 95 of the refractive surface 96 at which the imaging rays are primarily intended to be reflected and decreased in an annular region 97 of the refractive surface 96 at which the imaging rays are primarily intended to be transmitted.

The converging marginal rays 84*a* and 84*b* exit the Mangin mirror 80 through a convex refractive surface 106 within an aperture 102 of the concave reflective surface 100. The convex refractive surface 106 has a center of curvature at least approximately matching that of the concave reflective surface 100 so that both surfaces 100 and 106 occupy different portions of an uninterrupted shape (e.g., spherical shape) on the back of the refractive body 98. Although the converging radial rays approach the convex refractive surface 106 at relatively high angles of incidence, refraction is limited (e.g., to less than 10 degrees) by filling a space between the Mangin mirror 80 and the field correcting optic 82 with the liquid optical medium 86. The liquid optical medium 86, which can be degassed water, reduces refractive index differences across the convex refractive surface 106.

The field correcting optic 82 has a refractive body 108 together with a convex refractive surface 110 adjacent to the convex refractive surface 106 of the Mangin mirror 80 and a planar refractive surface 112 adjacent to the resist 14. As such, the field correcting optic 82 can be referred to as a piano-convex optic having positive focusing power. The field correcting optic 82 can also be referred to as a bilateral immersion optic because the convex refractive surface 110 is an immersion surface exposed to the liquid optical medium 86 and the planar refractive surface 112 is an immersion surface exposed to the liquid optical medium 88.

The elevated refractive indices of the liquid optical mediums 86 and 88 limit the amount of refraction (e.g., to less than 10 degrees) across the refractive surfaces 110 and 112 of the field optic 82. Although the marginal rays 84a and 84b approach the respective refractive surfaces 110 and 112 at substantial angles of incidence, refraction is restricted by the limited differences in the refractive indices of the optical mediums 86 and 88 on opposite sides of the refractive surfaces 110 and 112. While degassed water is preferred for both liquid optical mediums 86 and 88, a different optical liquid could be used for one or both. For example, the liquid optical medium 86 can be confined between the Mangin mirror 80 and the field optic 82 by a peripheral seal 114 independently of the liquid optical medium 88. Within the same overall design of the imaging system 70, the two liquid optical mediums 86 and 88 can be varied to accommodate different resists 14 and to make fine optical adjustments.

A table follows, listing the fabrication data in millimeters for making the illustrated catadioptric imaging system 70 operating similarly to the preceding embodiment at a 193 nanometer wavelength with a numerical aperture of 1.2 and a 15× reducing power.

| INFINITE CONJUGATES | |
|---|---|
| EFL | 62.0784 |
| BFL | −3.5384 |
| FFL | 562.7456 |
| F/NO | 0.4284 |
| AT USED CONJUGATES | |
| REDUCTION | 0.0667 |
| FINITE F/NO | 0.4167 |
| OBJECT DIST | 85.8698 |
| TOTAL TRACK | 602.8784 |
| IMAGE DIST | 0.6000 |
| OAL | 516.4086 |
| PARAXIAL IMAGE HT | 0.3535 |
| PARAXIAL IMAGE DIST | 0.6001 |
| SEMI-FIELD ANGLE | 0.4835 |
| ENTR PUPIL DIAMETER | 100.9403 |
| ENTR PUPIL DISTANCE | 542.9926 |
| EXIT PUPIL DIAMETER | 220.9644 |
| EXIT PUPIL DISTANCE | 132.3550 |

| Element Number | Radius of Curvature | | Thickness | Aperture Diameter | | Material |
|---|---|---|---|---|---|---|
| | Front | Back | | Front | Back | |
| Object 12 | INF | | 85.8698 | | | |
| 61 | 65.7102 | 51.6419 | 20.5066 | 23.0980 | 22.3354 | Silica |
| Space | | | 245.4068 | | | |
| 62 | 435.1054 | −150.4084 | 9.0483 | 69.8704 | 70.1300 | CaF$_2$ |
| Space | | | 102.1563 | | | |
| 63 | 116.2850 | 43.2535 | 6.6875 | 55.8903 | 52.7145 | Silica |
| Space | | | 20.6876 | | | |
| 64 | −47.7576 | −71.4321 | 12.0956 | 54.3401 | 64.5469 | Silica |
| Space | | | 7.0370 | | | |
| 65 | 134.9633 | −101.5776 | 17.8787 | 78.4571 | 79.2839 | CaF$_2$ |
| Space | | | 0.0200 | | | |
| 66 | 79.3961 | 56.4347 | 4.3609 | 77.2784 | 73.6386 | Silica |
| Space | | | 9.9511 | | | |
| 67 | 113.8151 | −132.3919 | 14.8674 | 74.1772 | 73.8734 | CaF$_2$ |
| Space | | | 6.8027 | | | |
| 68 | −73.9770 | −198.0131 | 5.0848 | 72.7498 | 74.3303 | Silica |
| Space | | | 11.3173 | | | |
| APERTURE STOP 69 | | | | 74.3728 | | |
| Space | | | 0.6827 | | | |
| 98(96-100) | −1043.7160 | −89.2413 | 19.7738 | 74.3736 | 74.9846 | Silica |
| 100 | | −89.2413 | | | 74.9846 | REFL |
| 98(100-96) | −89.2413 | −1043.716 | −19.7738 | 74.9846 | 74.9846 | Silica |
| 96 | | −1043.7160 | | | 48.5489 | REFL |
| 98(96-106) | −1043.7160 | −89.2413 | 19.7738 | 48.5489 | 74.9846 | Silica |
| 86 | −89.2413 | 4.0537 | 0.2000 | 10.0000 | 4.9516 | H$_2$O |
| 82 | 4.0537 | INF | 1.8436 | 4.9516 | 2.5397 | Silica |
| 88 | INF | INF | 0.6000 | 2.5397 | 10.0000 | H$_2$O |
| IMAGE 14 | INF | INF | | 10.0000 | | |

Although the partially reflective surface 96 is listed as having a negative radius of curvature indicative of a concave surface on the front side of the refractive body 98, the size of the radius of curvature is such that the surface 96 is still considered nominally planar. Also, while the reflective surface 100 and the refractive surface 106 share the same negative curvature, the reflective surface 100 is regarded as concave and the refractive surface 106 is regarded as convex in accordance with conventional optical designations.

Other first order data for defining the imaging system follows where FFL is measured from the first surface and BFL is measured from the last surface.

The spaces between elements of both depicted imaging systems 10 and 70 are generally air and preferably nitrogen, while the elements themselves are generally glass and preferably fused silica or calcium fluoride. One or more liquid mediums, preferably degassed water, are also envisioned on one or both sides of the final element 22 or 82. Generally, the designs favor achieving a high numeral aperture including numerical apertures substantially greater than one (e.g., 1.2) while minimizing the amount of refraction at interfaces throughout the designs.

In addition, the designs favor minimizing the inclination of marginal rays with respect to the optical axis 34 or 94 throughout most of the refractive optics 18 or 78 to minimize the influence of birefringence within the cubic crystalline materials (e.g., calcium fluoride). Most of the inclination occurs within the double-reflecting Mangin mirror 20 or 80 as a result of reflection. The refractive body 28 or 98 of the Mangin mirror 20 or 80 can be fused silica to minimize the effects of birefringence. However, even if a cubic crystalline material such as calcium fluoride is used in the refractive body 28 or 98 of the Mangin mirror 20 or 80, the multiple reflections have a clocking effect that tend to more uniformly distribute the birefringence effects. In fact, the clocking effects can be optimized by arranging the partially reflective surface 26 or 96 to approach a planer form so that the rays pass in opposite directions through the refractive body 28 or 98 at approximately equal angles with respect to the optical axis 34 or 94 (corresponding to the orientation of one of the crystal axes).

Generally, a central obscuration is required to prevent paraxial rays from passing directly through the refractive body 28 or 98 between the refractive surface 26 or 96 at the front side of the Mangin mirror 20 or 80 and the refractive surface 36 or 106 within the aperture 32 or 102 at the backside of the Mangin mirror. The obscuration assures that the Mangin mirror 20 or 80 has doubly reflected any of the light passing through the aperture 32 or 102.

The partially reflective surface 26 or 96 can also be arranged to have an angularly dependent radially symmetric polarizing effect on the light reflected on the further converging path to the aperture 32 or 102. At angles of incidence approaching but less than an angle of total internal reflection (e.g., in the vicinity of the Brewster angle), one of two orthogonal polarization directions (i.e., the polarization direction TM in the plane of incidence) is not reflected. The transmitted TM polarized light is lost. Since the Brewster angle is referenced in the plane of incidence and the incident rays are bent within a locus of axial planes intersecting the optical axis 34 or 94, the rays incident upon the reflective surface 26 or 96 at or near the Brewster angle are polarized with radial symmetry, apparent as an azimuthal distribution of polarized light.

Normally, such polarization losses are avoided if possible to make imaging systems more efficient. However, the invention provides for exploiting the resulting polarization symmetry to enhance imaging at high numerical apertures, such as found in the immersive optical systems 10 and 70. Randomly polarized light approaching the image plane from high angles of incidence includes a component of polarization along the optical axis that does not fully participate in image formation and has the effect of reducing overall contrast. It is the polarization direction (i.e., TM) in the plane of incidence to the resist 14 that is least desirable for image formation at the higher angles of incidence. The electric field vector of the TM polarization direction is inclined complementary to the optical axis 34 or 94 in accordance with the angle of incidence measured against a normal to the resist 14. Interference effects of the TM polarization are diminished by differences between the inclination angles of the electric field vectors within the same plane of incidence. For example, electric field vectors relatively inclined by 90 degrees within the same plane of incidence do not interfere at all. (A negative contrast is possible at higher incidence angle differences.) The problem does not affect the TE polarization direction, whose electric field vectors remain parallel to the plane of incidence throughout the entire range of incidence angles.

Further control over the incidence angles at the partially reflective surface 26 or 96 can be exploited to produce radial polarization symmetry for producing sharper imaging. Since the partially reflective surface 26 or 96 is located adjacent to a pupil of the imaging system 10, the marginal rays 24a and 24b or 84a and 84b that approach the partially reflective surface 26 or 96 at the highest angles of incidence also approach the resist 14 at the highest angles of incidence. Accordingly, by adjusting the shape, treatment (e.g., coatings) or refractive index difference across the partially reflective surface 26 or 96, the Brewster angle can be matched to a selected range of high incidence angles for the discarding the undesirable TM polarization within the selected range. The exact location of the Brewster angle (or a comparable angle) among the full span of incidence angles at which the converging beam strikes the partially reflective surface 26 or 96 can be set to favor transmissions of the TM polarization direction at the higher end of the span.

However, the higher incidence angles should remain less than the angle of total internal reflection to preserve the desired polarizing effect. The higher incidence angles can be reduced at the partially reflective surface 26 or 96 within the bounds of total internal reflection while maintaining the desired convergence angles "β" by increasing the convexity of the partially reflective surface 26 or 96. The converging beam that reflects from the partially reflective surface 26 or 96 is radially polarized, particularly at the higher inclination angles, favoring a polar orthogonal (e.g., azimuthal) polarization pattern capable of imaging with fuller contrast.

The same Brewster angle effects at the surface of the resist 14 tend to couple the undesired TM polarization more efficiently than the desired TE polarization. However, the reflectivity of the TM polarized light is reduced by the liquid optical medium 44 or 88, which decreases the refractive index difference across the surface of the resist 14. For example, for resists having a refractive index of 1.8, reflectivity of the TM polarization inclined by 57 degrees can be reduced from 24 percent to 8 percent by the presence of the liquid optical medium 44 or 48 having a refractive index of approximately 1.4 (e.g., water).

The polarizing effect of the partially reflective surface 26 or 96 preferably takes place within the domain of a pupil, such as adjacent to the aperture 59 or 69, where bundles of light, e.g., 17 and 19 of imaging system 10 or 117 and 119 of imaging system 70 emanating from the object points 13 and 15, overlap each other. Within the region of overlap, the bundles of light 17 and 19 or 117 and 119 are treated collectively so that each retains the radially symmetric polarization pattern (e.g., an azimuthal polarization pattern) upon approaching their unique image points in the image plane (the resist 14). Locating a radially symmetric polarizer within a similar domain can make a similar polarizing effect conjugate to the aperture stop 59 or 69.

Figure 5:
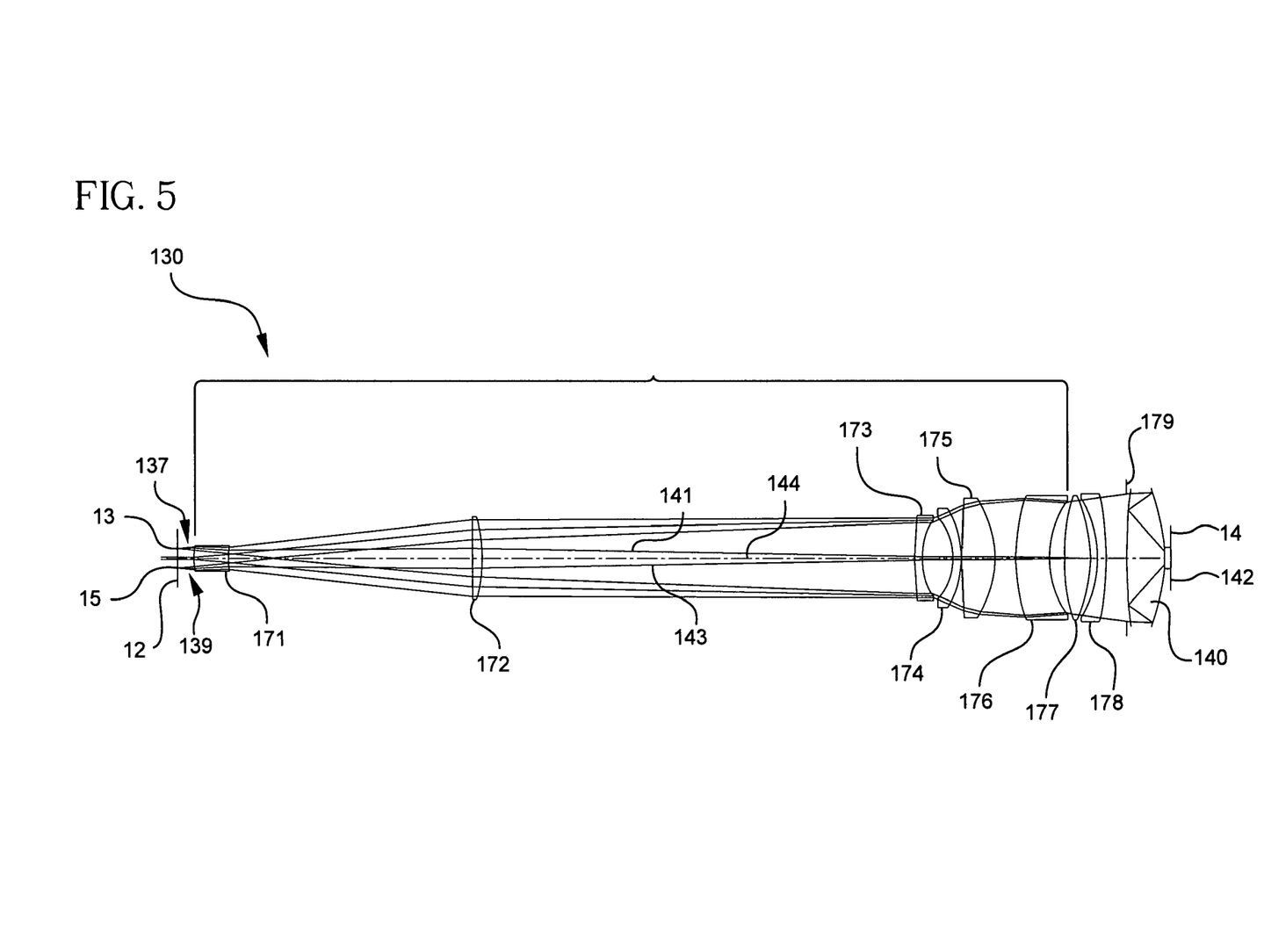
FIG. 5 is a similar diagram of a catadioptric imaging system with an immersion optic adjacent to an image plane.
Figure 6:
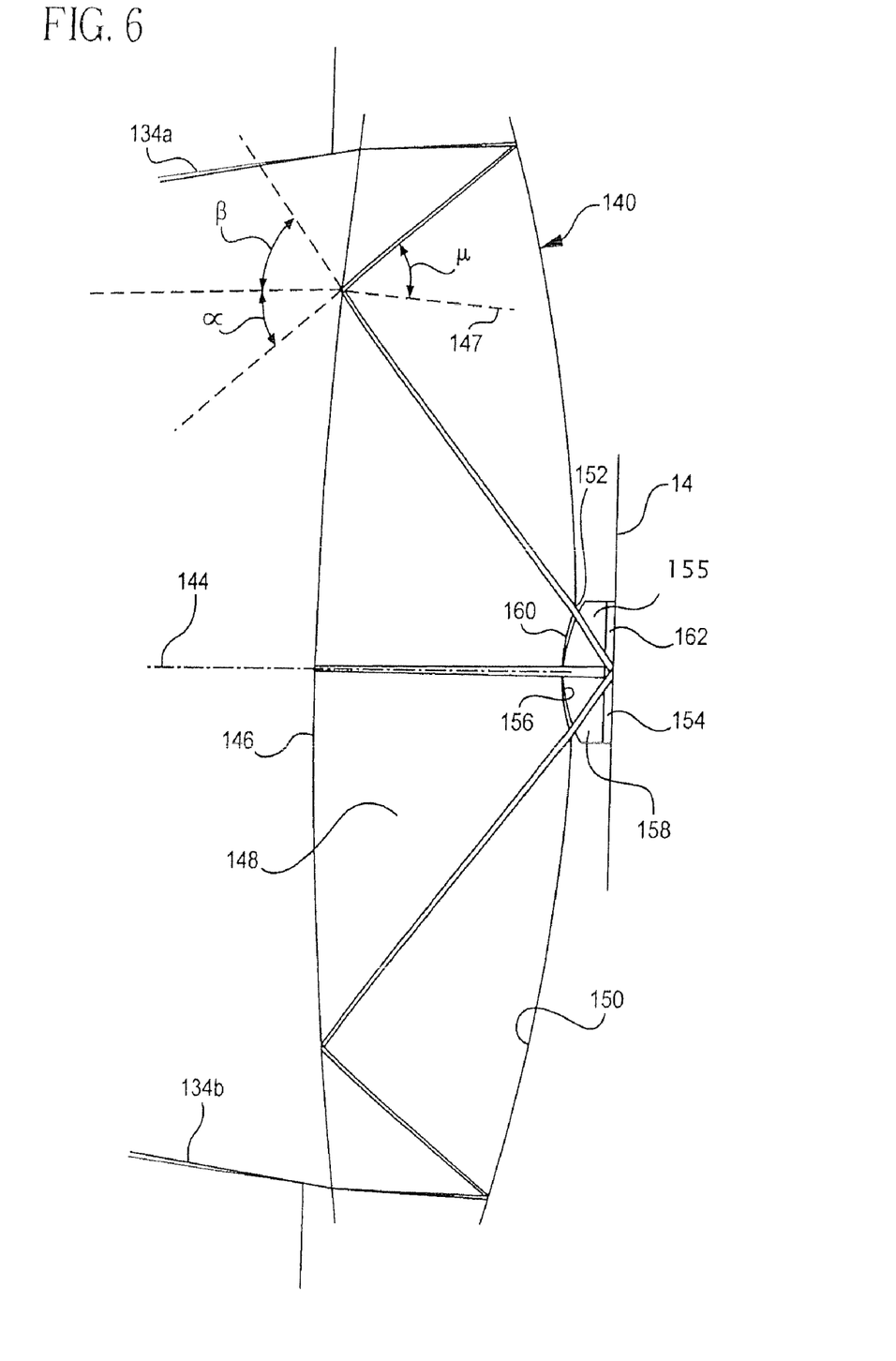
FIG. 6 is an enlarged diagram of a Mangin mirror and single-immersion field correcting optic of the imaging system of FIG. 5.

A double-telecentric catadioptric imaging system 130 together with another double-reflecting Mangin mirror 140 is shown in FIGS. 5 and 6. Similar to the two preceding embodiments, the imaging system 130 projects an image of the reticle (object) onto the resist 14 (image) at a high reduction ratio. However, the imaging system 130 is telecentric in both object space and image space.

Within the telecentric object space, chief rays 141 and 143 of light bundles 137 and 139 emanating from the representative object points 13 and 15 extend parallel to a common optical axis 144. Within the pupil space centered at an aperture stop 179, the chief rays 141 and 143 intersect the optical axis 144 and the light bundles 137 and 139 overlap each other. Within telecentric image space, the chief rays 141 and 143, were they not blocked by a stop in advance of the Mangin mirror 140, would return parallel to the optical axis 144 for forming corresponding image points in the resist 14. The light bundles 137 and 139, which overlap within the pupil space, can be collectively treated within the pupil space for having the same or similar effect on the formation of the corresponding image points in the resist 14.

The Mangin mirror 140 provides most of the focusing power, and a field correcting optic 142 associated with the Mangin mirror 140 has an immersive interface with the resist 14 for limiting refraction and increasing the numerical aperture. A refractive optical assembly 178, which fills the aperture 179 in advance of the Mangin mirror 140, is telecentric in form for object space, and the Mangin mirror 140 together with the field correcting optic 142 is telecentric in form for image space, each sharing a common pupil in the vicinity of the aperture 179.

As shown in FIG. 6, overlapping marginal rays 134a and 134b enter the Mangin mirror 140 by passing through a convex refractive surface 146 on an optically transmissive body 148. The marginal rays 134a and 134b propagate through the optical transmissive body 148 and reflect from a concave reflective surface 150 on converging paths inclined through angle "α" with respect to the optical axis 144. The convex refractive surface 146 also functions as a partially reflecting surface by reflecting the returning marginal rays 134a and 134b on a further converging path inclined through angle "β" with respect to the optical axis 144 toward an aperture 152 formed in the convex refractive surface 146.

In the two preceding embodiments in which the partially reflective surfaces 26 and 96 planar or nearly planar, the angles "α" and "β" are approximately equal to each other and to the angle of incidence at which the marginal rays strike the surface, measured with respect to a surface normal at the point of incidence. However, within the Mangin mirror 140, the angle "β" is significantly larger than the angle "α" because at the point of incidence, a surface normal 147 is inclined to the optical axis 144 due to the convexity of the convex refractive surface 146. The actual angle of incidence "μ" is equal to the average of the angles "α" and "β".

It is the angle of incidence "μ" that in part controls the reflective properties of convex refractive surface 146, while the angle "β" is in part responsible for the focusing power of the Mangin mirror 140. By controlling the convexity of the convex refractive surface 146, reflective properties of the convex refractive surface 146 can be adjusted independently of the focusing power of the Mangin mirror 140. This independent adjustment is particularly significant for exploiting the angular polarization sensitivity of the convex refractive surface 146. For example, the angle of incidence "μ" of the marginal rays 134a and 134b can be set less than the angle of total internal reflection so that the polarization characteristics of the marginal rays 134 remain differentially affected by the encounter of the marginal rays with the convex refractive surface.

For example, the angle of incidence "μ" can be set in the vicinity of the Brewster angle so than the convex refractive surface 146 favors reflection of the TE component of polarization over the TM component of polarization, which is lost by transmission. The differential effect is preferably most pronounced at higher angles of incidence. Since the convex refractive surface 146 is within a domain of the pupil at which the bundles of rays 137 and 139 substantially overlap, the polarization effect is similar within each of the bundles of rays 137 and 139. Thus, the TM polarization components associated with the higher incident angle rays at the image plane (the resist 14) are similarly minimized with a radial symmetry within each of the bundles 137 and 139 that matches the radial symmetry of the convex refractive surface 146 around the optical axis 144.

Although the differential polarizing effect of the convex refractive surface 146 is largely a function of the angle of incidence "μ" and the refractive index difference across the convex refractive surface 146, the polarizing effect can be further controlled by applying polarizing coatings or other treatments to the convex refractive surface. The relatively high angles of incidence at the convex refractive surface 146 make the surface especially suitable for achieving the desired angularly sensitive and radially symmetric polarizing effect. However, a different surface or optical construction could also be used within the domain of the pupil to achieve a desired radially symmetric polarizing effect on the overlapping bundles of rays 137 and 139.

Similar to the embodiment of FIG. 3, a concave refractive surface 156 is formed within the aperture 152 for limiting the angles of incidence at which the converging rays approach the aperture 152. The field correcting optic 155 has a convex refractive surface 160 on one side of an optically transmissive body 158 and a substantially planar surface 162 on an opposite side. The concave refractive surface 156 of the Mangin mirror 140 and the convex refractive surface 160 of the field correcting optic 155 depart in form to produce a field correcting effect through limited angles of refraction. The planar surface 162 is an immersion surface in contact with a liquid optical medium 154 for coupling the field correcting optic 155 to the resist 14 at a high numerical aperture but limited angles of refraction.

A table listing fabrication data in millimeters for the catadioptric imaging system 130 at a reference wavelength of 193.3 nanometers within a spectral of 192.6-194.0 nanometers follows.

| Element Number | Radius of Curvature | | Thickness | Aperture Diameter | | Material |
|---|---|---|---|---|---|---|
| | Front | Back | | Front | Back | |
| Object | | INF | 8.8120 | | | |
| 171 | 43.8766 | 32.2866 | 20.9205 | 12.0911 | 12.1413 | Silica |
| | | | 148.3546 | | | |
| 172 | −1715.9101 | A(1) | 5.9311 | 44.9003 | 45.4512 | CaF$_2$ |
| | | | 262.5214 | | | |
| 173 | 241.5870 | 47.0285 | 4.5000 | 47.3665 | 46.7355 | Silica |
| | | | 18.8190 | | | |
| 174 | −38.4333 | −57.1318 | 5.0020 | 49.0497 | 55.4000 | Silica |
| | | | 0.1482 | | | |

-continued

| Element Number | Radius of Curvature | | Thickness | Aperture Diameter | | Material |
|---|---|---|---|---|---|---|
| | Front | Back | | Front | Back | |
| 175 | 375.3203 | −63.6290 | 19.8929 | 62.8751 | 67.2032 | CaF$_2$ |
| | | | 12.6018 | | | |
| 176 | 106.4111 | 57.2145 | 19.9818 | 70.8697 | 67.1712 | CaF$_2$ |
| | | | 9.1360 | | | |
| 177 | 138.1296 | −82.3658 | 15.4741 | 68.6578 | 69.3138 | CaF$_2$ |
| | | | 4.5986 | | | |
| 178 | −66.3868 | A(2) | 5.0000 | 68.8332 | 72.1529 | Silica |
| | | | 11.9800 | | | |
| APERTURE STOP 179 | | | | 76.0465 | | |
| | | | 0.0200 | | | |
| (146-150) | 283.3503 | −118.5485 | 23.0274 | 76.7809 | 78.0418 | CaF$_2$ |
| 150 | −118.5485 | | | 78.0418 | | REFL |
| (150-146) | −118.5485 | 283.3503 | −23.0274 | 78.0418 | 78.0418 | CaF$_2$ |
| 146 | 283.3503 | | | 56.3647 | | REFL |
| (146-156) | 283.3503 | 14.6951 | 22.0074 | 56.3647 | 78.0418 | CaF$_2$ |
| | | | 0.0238 | | | |
| (160-162) | 9.0476 | INF | 3.5207 | 8.7659 | 3.0056 | Silica |
| 154 | INF | INF | 0.7539 | 3.0056 | 0.7070 | H$_2$O |
| IMAGE 14 | | INF | | 0.7070 | | |

As with the other tables, a positive radius indicates a center of curvature to the right, and a negative radius indicates a center of curvature to the left. Thickness is the axial distance between adjacent surfaces, and the image diameter is paraxial value rather than a ray traced value.

The optical elements 172 and 178 have aspheric back surfaces designated A(1) and A(2). These surfaces are defined by a set of coefficients reproduced in the table below in accordance with the following equation:

$$Z = \frac{(CURV)Y^2}{1 + (1 - (1+K)(CURV)^2 Y^2)^{1/2}} + (A)Y^4 + (B)Y^6 + (C)Y^8 + (D)Y^{10}$$

| SURFACE | CURV | K | A | B | C | D |
|---|---|---|---|---|---|---|
| A(1) | −0.00971830 | 0.000000 | −2.87514E−08 | −6.97112E−12 | 7.24275E−15 | −5.39628E−18 |
| A(2) | −0.00608055 | 0.000000 | 2.78960E−08 | −2.57837E−12 | 1.98478E−16 | 4.73140E−18 |

Other first order data for defining the imaging system follows where FFL is measured from the first surface and BFL is measured from the last surface.

| INFINITE CONJUGATES | |
|---|---|
| EFL | −1458.4794 |
| BFL | 97.9869 |
| FFL | −15239.5785 |
| F/NO | −0.0603 |
| AT USED CONJUGATES | |
| REDUCTION | 0.0667 |
| FINITE F/NO | 0.4167 |
| OBJECT DIST | 8.8120 |
| TOTAL TRACK | 600.0000 |
| IMAGE DIST | 0.7539 |
| OAL | 590.4341 |
| PARAXIAL IMAGE HT | 0.3535 |

| -continued | |
|---|---|
| PARAXIAL IMAGE DIST | 0.7540 |
| SEMI-FIELD ANGLE | 0.0029 |
| ENTR PUPIL DIAMETER | 16845.5552 |
| ENTR PUPIL DISTANCE | 104938.4560 |
| EXIT PUPIL DIAMETER | 142.3294 |
| EXIT PUPIL DISTANCE | 85.6641 |

Although described with respect to a limited number of embodiments, the invention, the descriptions and explanations of the invention render the invention applicable in a number of different ways for such purposes as high numerical aperture imaging, reducing aberrations, accommodating of deep UV wavelengths, and enhancing image contrast.

The invention claimed is:

1. A catadioptric imaging system comprising: a double-reflecting Mangin mirror having:
    an optically transmissive body,
    a partially reflective surface at a first side of the optically transmissive body for admitting light into the optically transmissive body and for partially reflecting the light within the optically transmissive body,
    a concave reflective surface at a second side of the optically transmissive body for returning the light to the partially reflective surface,
    an aperture within the concave reflective surface, and
    a concave refractive surface at the second side of the optically transmissive body within the aperture of the concave reflective surface,
    the concave reflective surface and the concave refractive surface at the second side of the optically transmissive body having nominal centers of curvature located in opposite directions along a common optical axis for reducing refraction angles at which the light exits the optically transmissive body through the aperture, the partially reflective surface and the concave reflective surface being arranged with respect to one another so that marginal rays of light approaching the partially reflective surface from the concave reflective surface strike the partially reflective surface at an angle of incidence that is less than an angle of total internal reflection; and the partially reflective surface being treated for enhancing a radially symmetric polarizing effect of the partially reflective surface favoring a reflection of one direction of the radially symmetric polarization with respect to an orthogonal direction of the radially symmetric polarization.

2. The imaging system of claim 1 in which the partially reflective surface is located within a pupil of the imaging system between an object plane and an image plane, and the enhanced radially symmetric polarizing effect relatively reduces TM polarization components parallel to axial planes of incidence at the image plane with respect to TE polarization components perpendicular to the axial plane of incidence at the image plane.

3. The imaging system of claim 2 in which the enhanced radially symmetric polarizing effect produces an azimuthal distribution of polarized light within the pupil.

4. The imaging system of claim 3 in which the partially reflective surface is coated for enhancing a radially symmetric polarizing effect.

5. The imaging system of claim 2 in which the enhanced radially symmetric polarizing effect is larger for light rays striking the partially reflective surface at larger angles of incidence.

6. The imaging system of claim 2 in which the partially reflective surface includes a coating that enhances polarization of overlapping bundles of rays within the pupil with a radial symmetry.

7. The imaging system of claim 6 in which the concave reflective surface and the partially reflective surface are arranged with respect to one another so that some rays of light approaching the partially reflective surface strike the partially reflective surface at Brewster's angle at which only one of the two orthogonal directions of radial polarization is reflected by the partially reflective surface.

8. The imaging system of claim 6 in which the TM polarization components of the rays are reduced as a function of incidence angle to the partially reflective surface.

9. The imaging system of claim 1 further comprising a partially reflective treatment applied to the partially reflective surface so that reflectivity of the partially reflective surface progressively varies as a function of radial distance from the optical axis to compensate for variations in reflectivity as a function of variations in angles of incidence at with the light approaches the partially reflective surface.

10. A Newtonian imaging system comprising:
a partially reflective interface between a first optical medium and a second optical medium;
a concave reflector adjacent to the second optical medium;
an aperture formed in the concave reflector;
the partially reflective interface, the concave reflector, and the aperture formed in the concave reflector having a common optical axis;
an at least partially transmissive interface within the aperture between the second optical medium and a third optical medium;
the second optical medium being a solid optical medium and the at least partially transmissive interface being formed between a concave refractive surface in the solid optical medium and the third optical medium;
a first optical pathway between the first optical medium and the concave reflector traversing through the partially reflective interface and the second optical medium;
a second optical pathway between the concave reflector and the partially reflective interface traversing through the second optical medium;
a third optical pathway between the partially reflective interface and an image plane traversing through the second optical medium, the at least partially transmissive interface, and the third optical medium,
the partially reflective interface and the concave reflector being arranged with respect to one another so that marginal rays of the light approaching the partially reflective interface from the concave reflector strike the partially reflective interface at an angle of incidence that is less than an angle of total internal reflection; and
a coating applied to the partially reflective interface for enhancing a radially symmetric polarizing effect of the partially reflective interface favoring a reflection of one direction of the radially symmetric polarization with respect to an orthogonal direction of the radially symmetric polarization.

11. The imaging system of claim 10 in which the partially reflective interface is located within a pupil of the imaging system between an object plane and the image plane, and the coating relatively reduces TM polarization components parallel to axial planes of incidence at the image plane with respect to TE polarization components perpendicular to the axial plane of incidence at the image plane.

12. The imaging system of claim 11 in which the third optical medium is a liquid optical medium.

13. A catadioptric imaging system for deep ultraviolet light having a Newtonian form comprising:
a combined reflective and refractive optic having a refractive body,
a reflective surface at one side of the refractive body,
a refractive surface at an opposite side of the refractive body, and
an aperture within the reflective surface along an optical axis;
the refractive surface being partially transmissive for transmitting light to the reflective surface;
the reflective surface having a concave form for reflecting the transmitted light on a converging path back toward the refractive surface;
the refractive surface also being partially reflective for reflecting the returning light on a further converging path through the aperture toward a focal point located along the optical axis;
the refractive surface being arranged with respect to the reflective surface so that marginal rays of the light approaching the refractive surface from the reflective surface strike the refractive surface at an angle of incidence that is less than an angle of total internal reflection; and
the refractive surface being treated for enhancing a radially symmetric polarizing effect of the refractive surface favoring a reflection of one direction of the radially symmetric polarization with respect to an orthogonal direction of the radially symmetric polarization.

14. The imaging system of claim 13 in which the refractive body is made of a cubic crystalline material and both the crystalline material and the refractive surface are oriented to radially balance birefringence effects of the crystalline material.

15. The imaging system of claim 13 further comprising a partially reflective treatment applied to the refractive surface so that reflectivity of the refractive surface progressively varies as a function of radial distance from the optical axis to compensate for variations in reflectivity as a function of variations in angles of incidence at with the light approaches the refractive surface.

16. The imaging system of claim 13 in which the refractive surface is located within a pupil of the imaging system between an object plane and an image plane, and the enhanced radially symmetric polarizing effect relatively reduces TM polarization components parallel to axial planes of incidence at the image plane with respect to TE polarization components perpendicular to the axial plane of incidence at the image plane.

17. The imaging system of claim 16 in which the enhanced radially symmetric polarizing effect produces an azimuthal distribution of polarized light within the pupil.

18. The imaging system of claim 13 in which the enhanced radially symmetric polarizing effect is larger for light rays striking the refractive surface at larger angles of incidence.

19. The imaging system of claim 18 in which the combined reflective and refractive optic contributes to connecting an object plane with an image plane along the optical axis, and the enhanced radially symmetric polarizing effect of the refractive surface differentially affects TM polarization components of the rays parallel to axial planes of incidence at the image plane with respect to TE polarization components of the rays perpendicular to the axial planes of incidence at the image plane.

20. The imaging system of claim 19 in which the enhanced radially symmetric polarizing effect of the refractive surface reduces TM polarization components of the rays parallel to axial planes of incidence at the image plane without substantially reducing TE polarization components of the rays perpendicular to the axial planes of incidence at the image plane.

* * * * *